United States Patent
Dai et al.

(10) Patent No.: US 7,224,300 B2
(45) Date of Patent: May 29, 2007

(54) FLOATING GATE DIGITAL-TO-ANALOG CONVERTER

(75) Inventors: Rongqing Dai, Castaic, CA (US); James S. Little, Saugus, CA (US); Kea-Tiong Tang, Temple City, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 0 days.

(21) Appl. No.: 10/308,438

(22) Filed: Dec. 2, 2002

(65) Prior Publication Data

US 2003/0102993 A1 Jun. 5, 2003

Related U.S. Application Data

(60) Provisional application No. 60/337,601, filed on Nov. 30, 2001.

(51) Int. Cl.
*H03M 1/00* (2006.01)

(52) U.S. Cl. .................. 341/136; 341/134; 341/144

(58) Field of Classification Search ........... 341/143, 341/136, 133, 144–154
See application file for complete search history.

(56) References Cited

U.S. PATENT DOCUMENTS

| | | | | |
|---|---|---|---|---|
| 4,547,762 A * | 10/1985 | Ono ........................ 341/133 |
| 4,551,705 A * | 11/1985 | Anderson ................. 341/136 |
| 5,109,844 A | 5/1992 | de Juan, Jr. et al. |
| 5,111,204 A * | 5/1992 | Katzenstein ............. 341/150 |
| 5,376,935 A | 12/1994 | Seligson .................. 341/136 |
| 5,631,647 A * | 5/1997 | Huang ...................... 341/136 |
| 5,703,582 A | 12/1997 | Koyama et al. .......... 341/120 |
| 5,935,155 A | 8/1999 | Humayun et al. |
| 6,037,885 A * | 3/2000 | Schmitt-Landsiedel et al. ...................... 341/136 |
| 6,088,017 A * | 7/2000 | Tremblay et al. ........ 345/156 |
| 6,181,969 B1 | 1/2001 | Gord |
| 6,191,715 B1 | 2/2001 | Fowers |
| 6,246,351 B1 | 6/2001 | Yilmaz .................... 341/145 |
| 6,545,625 B2 | 4/2003 | Hottgenroth ............. 341/155 |
| 6,567,023 B1 * | 5/2003 | Iwata ....................... 341/126 |
| 6,819,277 B1 * | 11/2004 | Hu et al. .................. 341/144 |
| 7,030,799 B2 | 4/2006 | Lee et al. ................. 341/144 |
| 7,068,201 B1 * | 6/2006 | Chou ....................... 341/144 |

OTHER PUBLICATIONS

Figueroa et al. "A Floating-Gate High-Resolution DAC in Standard 0.25μm CMOS" Aug. 2001, Nonvolatile Semiconductor Memory Workshop, Monterey, CA, XP002360974 Retrieved from the Internet: URL:http://www.cs.washington.edu/homes/dio-rio/Publications/CoAuthConfPapers/MiguelFigueroa/NVSMW01.pdf>.

* cited by examiner

*Primary Examiner*—Linh Nguyen
(74) *Attorney, Agent, or Firm*—Tomas Lendvai; Scott Dunbar

(57) ABSTRACT

The present invention provides a DAC constructed from a series of floating gate devices which are programmable to a series of predetermined values. Addressing one or more of the programmed floating gate devices, will select from a wide variety of analog outputs. Reprogramming the floating gate devices, can provide a different variety of analog outputs. For example, the floating gate devices can be preprogrammed to a different range of outputs matching a range of perceptible signals.

4 Claims, 2 Drawing Sheets

FLOATING GATE DIGITAL-TO-ANALOG CONVERTER

CROSS REFERENCE TO RELATED APPLICATIONS

This application claims priority of U.S. Provisional Patent Application No. 60/337,601, filed Nov. 30, 2001, Entitled Floating Gate Digital to Analog Converter.

GOVERNMENT RIGHTS

This invention was made with government support under grant No. R24EY12893-01, awarded by the National Institutes of Health. The government has certain rights in the invention.

FIELD OF THE INVENTION

The present invention relates a digital-to-analog converter (DAC) and more particularly to a reduced size programmable DAC suitable for implantable medical devices.

BACKGROUND OF THE INVENTION

The medical industry has developed a wide range of uses for implantable electrical stimulators, some are well developed while some are still experimental. Uses include pacemakers, cochlear stimulators for the deaf, retinal stimulators for the blind, and muscle stimulators to cure paralysis, chronic pain, sleep apnea, reduction of spasticity in limbs and eyelid droop.

In each of these technologies, the amount of current provided to a given electrode must be externally controllable. External control is typically provided by a digital signal transmitted to the implanted device. A small efficient and flexible digital-to-analog converter (DAC) and driver are required to convert the transmitted digital signal to a current level at each stimulator electrode.

These devices very quickly become large and complex. For example, a retinal stimulator for the blind requires one electrode for each pixel of light perceived. The current on each electrode, must change dynamically, with changes in the intensity of the light signal provided to the retina. A large number of electrodes, and a large number of corresponding DACs and drivers, are required to provide even limited vision. In addition to the varying signal relative to perceived light, the perception threshold and maximum tolerable level vary from person to person. Because the perceptible range is different for each individual, a DAC with a broad enough range to work for all people, would also provide levels unusable for many or those people. As the surgery for implanting such devices is quite complex, it would be an unreasonable burden on a patient to switch out a DAC for one with a different range.

One DAC is described in U.S. Pat. No. 6,181,969, ("Gord"). Gord discloses an efficient array of DACs for a cochlear stimulator. However, the Gord device requires preset devices which, when selected, provide a predetermined current level. A finite set of current levels are available. Once a device is implanted, it is impossible to change the range of selectable outputs. By summing the output of each device, it is possible to compound the possible output currents by two (i.e. 2 devices—4 levels, 3 devices—8 levels, 4 devices—16 levels, etc.). To achieve a reasonable level of sight for most people, would require an implant so large and complex, that it could not be implanted in or near the eye.

What is needed is a simple, efficient, and flexible DAC and driver that can provided a wide range of current levels. It is also important that a large number of DACs and drivers be manufacturable in a small package at a reasonable cost.

SUMMARY OF THE INVENTION

The present invention addresses these and other short comings in the prior art by providing a DAC constructed from a series of floating gate devices. Floating gate devices are programmable to a predetermined value. Addressing one or more of the programmed floating gate devices, will select from a variety of analog outputs. Reprogramming the floating gate devices, can provide a different variety of analog outputs. For example, the floating gate devices can be reprogrammed to a different range of outputs matching a range of perceptible signals.

BRIEF DESCRIPTION OF THE DRAWINGS

Preferred embodiments demonstrating the various objectives and features of the invention will now be described in conjunction with the following drawings.

DETAILED DESCRIPTION OF THE PREFERRED EMBODIMENTS OF THE INVENTION

Figure 1:
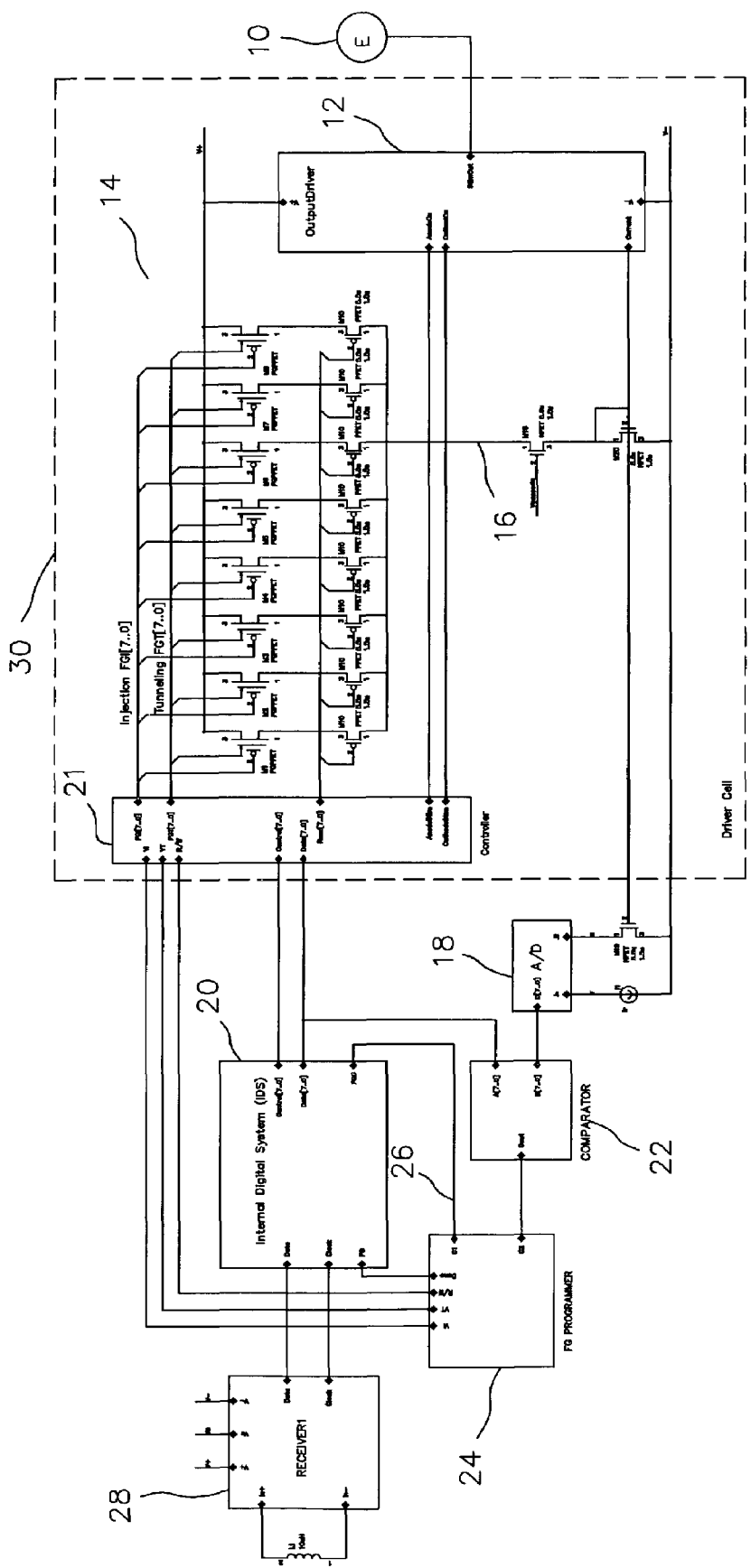
FIG. 1 is a schematic diagram of the floating gate digital to analog converter.

FIG. 1 shows the floating gate digital analog converter (DAC) of the present invention. The DAC provides electrical current to an electrode 10, through a driver 12. A series of floating gate devices 14 provide current, via a common output 16 to the driver 12. The common output 16 is also coupled to an analog-to-digital converter (ADC) 18. The ADC 18 provides a digital measurement of the current output of the floating gate devices 14. An internal digital system 20 activates each floating gate device individually, or in combination, through a controller 21. The digital address signal from internal digital system 20 is compared with the output of the ADC 18 in a comparator 22. When a match is detected between the output of ADC 18 and the internal digital system 20, the comparator 22 signals a floating gate programming controller 24. The floating gate programming controller 24 is initialized by a program signal 26 from the internal digital system 20.

At startup the internal digital system 20 begins the programming cycle. In the preferred embodiment, the floating gate devices are programmed from a highest level device associated with a most significant bit to a lowest level device associated with a least significant bit, each device is programmed to half the value previous device. It should be noted that a significant advantage of the present invention is that floating gate values can be reprogrammed dynamically, increasing the number of available values.

The preferred neural stimulator provides a plurality of electrodes 10. Each electrode 10 must have its own driver cell 30, including a controller 21, series of floating gate devices 14, and driver 12. However, the ADC 18, the internal digital system 20, the comparator 22, and the floating gate programming controller 24 may be multiplexed across a series of driver cells 30 and electrodes 10.

During stimulation, a receiver 28 receives a signal from an external transmitter (not shown) with stimulation information. The receiver provides the stimulation information to the internal digital system 20, which then addresses the controller 21 and floating gate devices 14, resulting in the selected current being provided to the electrode 10.

Figure 2:
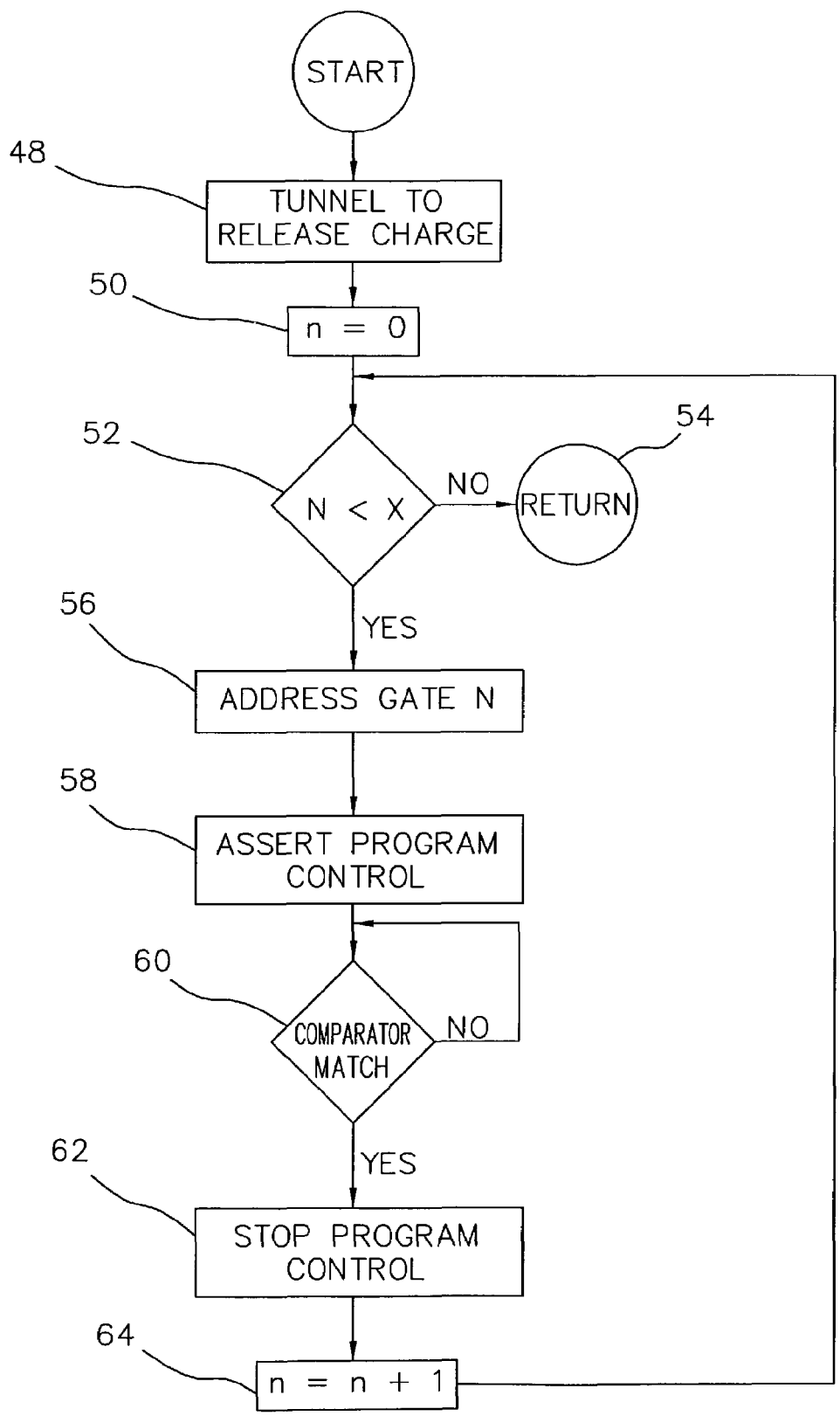
FIG. 2 is a flow chart of the floating gate programming process.

Referring to FIG. 2, the programming process begins with tunneling to release some of the electron charges from each device 48, before injecting charges to raise the current output. Next, a counter, n is set to zero 50. While the counter, n is less than the maximum number of floating gate devices, x 52, the internal digital system 20 addresses the first device 56 and signals the floating gate programming controller 24 to begin the programming process 58. The floating gate programming controller 24 provides a write signal to the addressed floating gate device. When the current from the first floating gate device reaches a desired level, the output from the internal digital system 20 matches the output from the ADC 18, and the comparator 22 signals 60 the floating gate programming controller 24 to end that programming cycle 62. This process is then repeated for each floating gate device by increasing the counter, n 64 and returning to step 52. The process returns when n reaches to total number of gates 54. Next the internal digital system 20 will program the next array of gates, if any are left to be programmed.

The total current provided to the driver 12, is the sum of the outputs of the addressed floating gate devices. Hence, 8 floating gate devices can provide 256 different current levels to the driver 12. Once programming is complete stimulation can begin by addressing any combination of floating gate devices.

All of the devices shown can be implanted within a living body and coupled to an external transmitter by inductive coupling, radio frequency, optical or other signaling means. The external transmitter can provide floating gate addresses, and thereby, current levels for each electrode.

The above detailed description is provided to illustrate the specific embodiments of the present invention and is not intended to be limiting. Numerous variations and modifications are possible within the scope of the present invention.

We claim:

1. A stimulator cell, comprising:
    at least one floating gate device providing analog current value;
    an output device coupling a sum of the analog current values to a tissue through an electrode;
        a first floating gate device controller to program the at least one floating gate device; and
    a second floating gate device controller to address one or more of the programmed floating gate devices to provide a total output current corresponding to the sum of the analog current values of the addressed floating gate devices.

2. The stimulator cell according to claim 1 wherein said cell is suitable for implantation in a living body.

3. The stimulator cell according to claim 2 comprising a receiver coupled to said second floating gate device controller for receiving a programming signal external to the living body.

4. The stimulator cell according to claim 1 wherein said at least one floating gate device is part of a digital to analog converter.

* * * * *